United States Patent

Eriksson et al.

[15] 3,652,903

[45] Mar. 28, 1972

[54] FLUID COOLED PRESSURE ASSEMBLY

[72] Inventors: Lars O. Eriksson, West Chester; Daniel B. Rosser, Springfield, both of Pa.

[73] Assignee: General Electric Company

[22] Filed: Feb. 1, 1971

[21] Appl. No.: 111,237

[52] U.S. Cl. ....................317/234 R, 317/234 A, 317/234 B, 317/234 G, 174/15, 165/80

[51] Int. Cl. ..........................................H01l 3/00, H01l 5/00

[58] Field of Search ...................317/234, 11.5, 100; 165/80; 174/15

[56] References Cited

UNITED STATES PATENTS

| | | | |
|---|---|---|---|
| 2,992,372 | 7/1961 | Himeon et al. | 317/234 |
| 3,364,987 | 1/1968 | Bylund et al. | 317/234 |
| 3,389,305 | 6/1968 | Bond | 317/234 |
| 3,523,215 | 8/1970 | Steinmetz et al. | 317/234 |
| 3,573,574 | 4/1971 | Davis | 317/234 |

*Primary Examiner*—John W. Huckert
*Assistant Examiner*—Andrew J. James
*Attorney*—J. Wesley Haubner, Barry A. Stein, Frank L. Neuhauser, Oscar B. Waddell and Joseph B. Forman

[57] ABSTRACT

Disclosed is a cooled pressure assembly for applying clamping pressure to a plurality of semiconductor rectifiers and for electrically connecting them in parallel. The pressure is applied via a pair of heat dissipating electrodes disposed on opposite sides of the rectifiers. Each electrode contains a plurality of heat dissipating fins which make up a plurality of cooling fluid ducts immediately adjacent the rectifiers. Clamping force exciting means are provided to center the clamping forces axially on the rectifiers and to apply them through the electrodes and the fins therein contained to the rectifiers.

4 Claims, 4 Drawing Figures

INVENTORS:
LARS O. ERIKSSON,
DANIEL B. ROSSER,
BY Barry A. Stein
ATTORNEY

INVENTORS:
LARS O. ERIKSSON,
DANIEL B. ROSSER,
BY Barry A. Stein
ATTORNEY

FLUID COOLED PRESSURE ASSEMBLY

BACKGROUND AND OBJECTS OF THE INVENTION

This invention relates to semiconductor rectifier assemblies, and more particularly it relates to such assemblies wherein a plurality of high current semiconductor devices are jointly mounted in compression.

In copending U.S. Pat. application, Ser. No. 88,056, filed on Nov. 9, 1970 and assigned to the same assignee of this invention there is disclosed and claimed novel heat dissipating assemblies for mounting broad area high current semiconductor rectifiers under pressure.

Such rectifiers are commonly constructed with a broad area semiconductor wafer, having at least one PN rectifying junction, hermetically sealed in a housing including an insulating sleeve and a pair of conductive terminals which contact opposite sides of the wafer and cap the respective ends of the sleeve. Intimate contact can be maintained between the wafer and the terminal members of such rectifiers by the application of high pressure to the latter without utilizing solder or other bonding means.

In operation the passage of current through the rectifying junctions results in the generation of heat therein. Any contact resistance between the wafer and the terminals is another source of heat. Since the current handling ability of a semiconductor rectifier is temperature limited, it is important to minimize the contact resistance while efficiently extracting the heat that is generated. Toward that end the rectifier is sandwiched between opposing heat sinks which are clamped together by external spring means to apply high pressure evenly over the entire are of the interposed wafer to achieve and maintain low electrical and thermal contact resistance and to conduct heat away from the rectifier. For higher current ratings, an array of similarly poled rectifiers can be mounted in parallel between a single pair of heat sinks. Here it is particularly important to efficiently extract and radiate the rectifier-generated heat.

According to the above-mentioned copending application each of the heat sinks which are disposed on opposite sides of a parallel array of semiconductor rectifiers comprises a heat dissipating electrode having a plurality of cooling fluid ducts therein. The cooling ducts are formed by a plurality of heat dissipating fins connected between a pair of members, with the fins serving to transmit thrust from the external spring means to one of said members which has a planar surface parallel to the adjacent terminals of the rectifiers. The ducts in the electrode are relatively narrow and are disposed immediately adjacent to the sandwiched rectifiers so that high velocity, turbulent air passing therethrough is effective for cooling the rectifiers.

Clamping pressure for the rectifiers is applied axially to each rectifier through the heat dissipating electrodes. This may be accomplished by means of a single tie-bolt-belleville washer configuration, adapted for applying pressure to as many as four parallel rectifiers in the assembly (see FIG. 5 of U.S. Pat. No. 3,471,757—Sias).

An improved alternative comprises a separate tie bolt-leaf spring configuration for each pair of a plurality of pairs of rectifiers (like that shown in the above-mentioned copending application). The latter configuration forms the subject of our present invention. In pressure assemblies like those herein disclosed, such a configuration has several advantages over the single tie-bolt-bellevile washer configuration, namely; the assemblies can be manufactured at a lower cost by using less expensive clamping components, and they can be made to house any number of rectifier pairs. The latter feature is desirable, since pressure assemblies for various applications can be constructed using common clamping components, thereby further reducing manufacturing costs. Further, the use of a single tie bolt-leaf spring configuration for each pair of rectifiers provides a pressure assembly which can be readily serviced to replace inoperative rectifiers or broken leaf springs without affecting the structural integrity of the entire assembly.

Further still, the use of our clamping configuration offers wide latitude in adjusting the pressure on individual rectifiers sandwiched in the assembly.

It is therefore an object of our invention to provide an economical and easily serviceable clamping configuration for applying axial pressure to plural pairs of semiconductor rectifiers sandwiched between a pair of heat dissipating electrodes in a pressure assembly.

SUMMARY OF THE INVENTION

In carrying out our invention in one form, means are provided for applying axial clamping pressure to plural pairs of rectifier devices mounted with their axes parallel to one another in a semiconductor rectifier pressure assembly. The clamping pressure is applied via a pair of opposed heat dissipating electrodes, each comprising a first member having a planar contact surface, a second member, and a plurality of force-transmitting-heat-dissipating fins connected therebetween and making heat conductive engagement with said first member. The rectifiers are disposed between the opposed heat dissipating electrodes with their anode terminals in intimate heat engagement with a planar contact surface of one electrode and with their cathode terminals in intimate heat engagement with a planar contact surface of the other electrode. In order for the heat dissipating electrodes to apply clamping pressure to the rectifiers, means are provided for applying a clamping force to the heat dissipating electrodes at selected points on their second members which are coaxial with the rectifiers. The force is transmitted through those members, the heat dissipating fins and the first members to the rectifier terminals. In accordance with our invention the clamping means comprise a two ended tension member associated with each pair of rectifiers mounted in the assembly. Each tension member is located between and parallel to the axes of its associated pair of rectifiers and extends through both of said heat dissipating electrodes. Disposed at each end of each tension member is a resilient member adapted for applying the clamping force to the selected points on the second members of the heat dissipating electrodes.

The effect of the above construction is that the rectifier devices are axially clamped between the contact electrodes in a simple, yet rugged and readily serviceable construction.

BRIEF DESCRIPTION OF THE DRAWINGS

Our invention will be better understood and its various objects and advantages will be more fully appreciated from the following description taken in conjunction with the accompanying drawings in which.

DETAILED DESCRIPTION OF PREFERRED EMBODIMENTS

Some of the features shown and described herein form the subject of a copending U.S. Pat. application Ser. No. 88,056 filed Nov. 9, 1970 and assigned to the same assignee as our invention.

Figure 1:
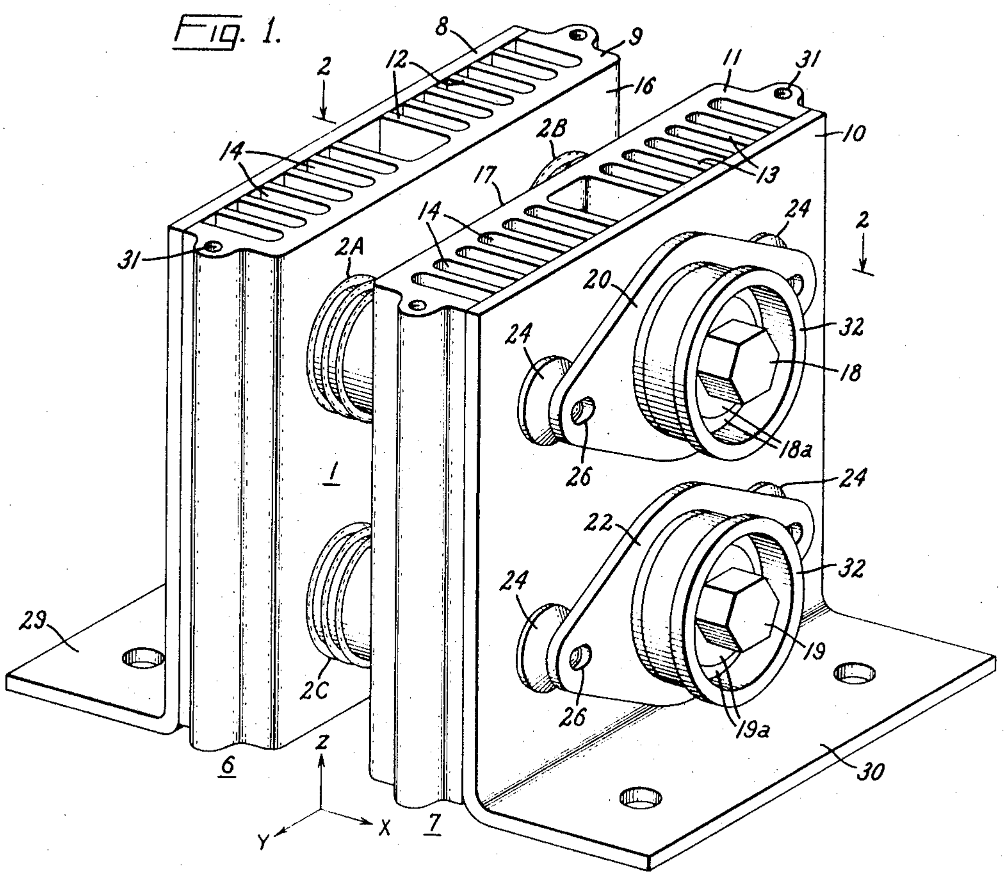
FIG. 1 is a perspective view of a semiconductor rectifier pressure assembly in accordance with our invention.

Insofar as our invention is concerned, FIG. 1 shows a pressure assembly holding four high current semiconductor rectifier devices each of which may be of the style shown on pages 349–351 of the General Electric SCR Manual 4th Edition (1967). The individual rectifier devices are electrically and mechanically connected in parallel in the compact assembly to provide a very high current handling capability. Further, the rectifiers mounted in one pressure assembly may be electrically connected in series with those in other similar assemblies to form a high voltage valve suitable for connection with other such valves to form a bridge circuit for a HVDC system.

In order to maintain operating integrity of the rectifier devices in such a system, cooling means are preferably provided to extract the heat generated by the devices during their operation. In a copending U.S. Pat. application Ser. No. 49,893 filed Dec. 21, 1971 and assigned to the same assignee as our invention, there is disclosed an air cooling system for a HVDC valve in which cooling air is driven through a housing containing a plurality of rectifier-holding pressure assemblies such as those herein disclosed. That system is arranged so that equal amounts of cooling air pass through the passages in the assembly as the result of a high pressure drop therethrough to efficiently extract the heat generated by the rectifier devices contained therein.

In order to cool the individual rectifiers most efficiently, it is preferable to utilize the passage of high velocity, turbulent air through cooling ducts which are arranged in intimate relationship with those rectifiers. Accordingly, the assembly is designed so that narrow, turbulence-creating cooling ducts are in close proximity with the rectifier devices to provide effective large area cooling surfaces immediately adjacent thereto.

Figure 2:
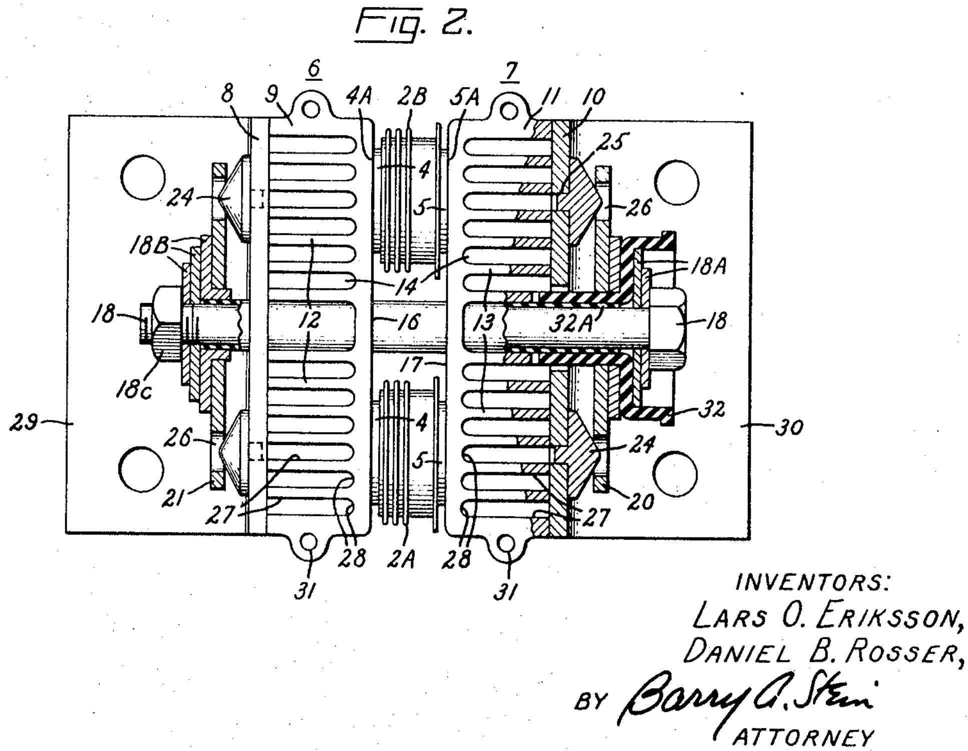
FIG. 2 is a partial cross sectional view along line 2—2 of FIG. 1.
Figure 3:
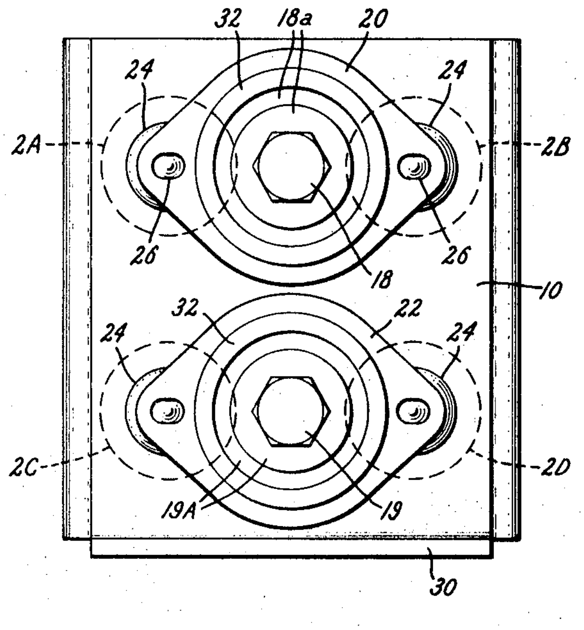
FIG. 3 is an end view of FIG. 1.

As shown in FIGS. 1–3 pressure assembly 1 houses four high current semiconductor rectifier devices, namely, 2A, 2B, 2C and 2D. These devices are arranged in pairs with 2A and 2B forming one pair and 2C and 2D forming a second pair. All of the devices are oriented so that their axes are parallel to one another. Each device comprises a broad area disklike semiconductor wafer (not shown) having at least one PN rectifying junction. The wafer is disposed in a ceramic sleeve and sandwiched between a pair of terminals 4 and 5. Each terminal has a relatively flat external contact surface which is perpendicular to the axis of the device. Terminal 4 and its associated contact surface 4A form the anode of the rectifier while terminal 5 and its associated contact surface 5A forms the cathode.

The devices shown in FIGS. 1–3 may be either diodes or thyristors (i.e., controlled rectifiers) depending upon the function to be performed. If the devices are thyristors the wafers are characterized by four layers of silicon of alternately P and N type conductivity, one of which has a gate contact which is connected to an external gate lead (not shown).

Each device is disposed mechanically between and connected electrically in series with a pair of opposed heat dissipating electrodes 6 and 7 which serve as combined electrical and thermal conductors. Towards this end these electrodes are made of a conductive metal such as aluminum. Electrode 6 includes a pair of planar members 8 and 9. Sandwiched between these members are a plurality (e.g., force transmitting heat dissipating fins 12 which may be integral with member 9, or may be integral with both members 8 and 9 if desired. Similarly, contact electrode 7 includes a pair of planar members 10 and 11 and a plurality of force transmitting heat dissipating fins 13 therebetween which may be integral with members 10 and 11 if desired. Preferably member 9 and its associated fins 12 are formed from an integral aluminum extrusion, as is member 11 and its associated fins 13. The fins are relatively stubby (e.g., one eighth inch thick and 1¼inches high) and are disposed close to one another (e.g., one quarter inch apart) to form a plurality of narrow cooling fluid ducts or passages 14 which extend for a short distance (e.g., 7 inches) in a direction perpendicular to the axes of the rectifiers.

The anode, cathode and semiconductor wafer of each rectifier device are conductively coupled by pressing their contiguous surfaces together under high pressure. This is accomplished by sandwiching the devices under pressure between the electrodes 6 and 7. Toward that end planar member 9 includes a relatively planar or flat side 16 which is generally parallel to the contact surfaces of all of the rectifiers and is adapted to abut in intimate heat engagement the anode contact surfaces of all of the rectifiers. Planar member 11 includes a relatively planar or flat side 17 similarly oriented and adapted to abut in intimate heat engagement their cathode contact surfaces. No solder or other means is used for bonding the rectifier parts and the contact electrodes together and the contact electrodes are completely separable from the rectifiers. Nevertheless, good electrical and thermal conductivity at the junctions of these parts is obtained in our assembly by subjecting the contact electrodes to high force (e.g., 8,000 pounds) distributed evenly over the devices.

In order to insure that even distribution of pressure exists over substantially the whole wafer area of each of the parallelly connected rectifiers, means are provided for directing the clamping force axially on each rectifier. Such means are provided for each pair of rectifiers mounted in the assembly. As can be seen in FIG. 2 a central tension member or tie bolt 18 is provided to extend between the pair of rectifiers 2A and 2B parallel to and in the plane of their axes. A similarly constructed and disposed tie bolt 19 is provided between the pair of rectifiers 2C and 2D. Coupled to respective ends of tie bolt 18, via respective washers 18A and 18B, are resilient members or leaf springs 20 and 21. Similar leaf springs 22 and 23 are coupled to the ends of tie bolt 19 via respective washers 19A and 19B. The function of the leaf springs is to transmit a compressive force, which is generated by tightening the tie bolts, to the heat dissipating electrodes, which in turn transmit it to the rectifiers sandwiched therebetween.

In order to insure that the compressive force is applied axially on the rectifiers, conical pressure spreading members 24 are disposed coaxially therewith. These members are held in position in restraining holes 25 of planar members 8 and 10. The conical members are adapted to sit in and to coact with elongated slots 26 which are provided in each leaf spring. The slots in each spring are oriented so that their major axis lies along the straight line connecting them. Therefore, upon tightening of their associated tie bolts, the compressive force from the springs thereon will be applied to portions of the heat dissipating electrodes centered over the axes of the sandwiched rectifiers, notwithstanding the fact that the slots would have moved relative to the conical member seated therein as a result of the springs' flexure as the bolts are tightened. Conical members 24 are provided with relatively large bases so that the compressive force from the leaf spring is spread out over a portion of planar members 8 and 10. This insures that the applied force, although centered coaxially on the rectifiers, is nevertheless transferred to those rectifiers via a plurality of the stubby heat dissipating fins and the planar members. In so doing the clamping force will be equalized across the anode and cathode contact surfaces on the clamped rectifiers.

Planar members 9 and 11 are relatively thin so as to afford some flexibility about the Z axis (this axis is shown in FIG. 1). The ability to flex in this manner insures that the same amount of pressure that is applied to rectifier 2A is applied to rectifier 2B and that the same amount of pressure that is applied to rectifier 2C is applied to rectifier 2D, even if all of the rectifiers' contact surfaces are not precisely coplanar or if either planar surfaces 16 or 17 are not perfectly flat. Accordingly, surfaces 16 and 17 need not be machined flat to close tolerances.

Due to the orientation of fins 12, the contact electrodes are relatively inflexible about the Y-axis (this axis is shown in FIG. 1). Nevertheless, some slight flexure is possible about that axis. Therefore the use of a tie bolt-leaf spring clamping configuration for each pair of rectifiers enables with minimal applied force the easy removal of an inoperative rectifier by merely loosening the tie bolt associated therewith and spreading the contact electrodes slightly apart. If a leaf spring has broken it may be replaced by removing its associated tie bolt without necessitating the disassembly of the entire pressure assembly, thus reducing repair time. Further, if a leaf spring were broken the assembly may still be capable of electrical operation, albeit at a lower current level, since the other tie bolt-leaf spring configuration will apply enough pressure to keep its associated rectifiers adequately clamped. Further still, our clamping configuration enables the pressure on individual pairs of rectifiers to be adjusted, by tightening or loosening their associated tie bolt, without materially affecting the pressure on the other rectifiers.

By utilizing the heat dissipating fins as a means for transmitting the clamping pressure to the sandwiched rectifiers large cooling surfaces are provided immediately adjacent the contact surfaces of the rectifiers. As can be seen in FIG. 2 there are relatively large cooling surfaces 27 and 28 immediately adjacent anode 4 and cathode 5, which surfaces are available for extracting the heat generated by the rectifiers during operation. Further, as was previously noted the closely spaced fins create narrow cooling ducts or passages through which air may be passed at high velocities. The passage of such air through the narrow cooling ducts results in some air turbulence therein. As will be appreciated by those skilled in the art, high velocity-turbulent-air is quite effective in extracting heat from a hot body, in that the insulating layer of air which normally exists immediately adjacent that body is scrubbed away by the turbulence. Therefore, it should be appreciated that the construction of the heat dissipating electrodes, with narrow cooling ducts immediately adjacent the rectifier electrodes, serve to effectively extract the heat generated by the rectifiers during their operation.

Anode end electrode 6 of assembly 1 is suited for electrical connection to other assemblies in the HVDC valve via terminal connector 29 while cathode end electrode 7 is suited for connection to other assemblies via terminal connector 30. If desired, planar members 9 and/or 11 can also be used for this function. The entire pressure assembly 1 may be mounted on panel structures in an insulating housing, like that disclosed in copending application Ser. No. 11,314 filed Feb. 2, 1971 by bolting the assembly to the housing via holes 31.

Since electrode 6 is electrically connected to the anode of the rectifier assembly while electrode 7 is electrically connected to the cathode and since tie bolts 18 and 19 pass through both of the contact electrodes, each tie bolt is insulated from one electrode to prevent a short circuit. For example, tie bolt 18, as shown in FIG. 2, is electrically connected to the anode of the rectifiers via the electrode 6, conical members 24, spring 21 and washers 18B and nut 18C. To insulate this tie bolt from the cathode contact electrode an insulating sleeve 32 is provided about that tie bolt where it passes through the electrodes. To insulate the bolt from the cathode electrode outside of that electrode an insulating cup 32A is provided disposed between washers 18A and spring 20. A similar insulating sleeve and cup is disposed about tie bolt 19.

In electrical operation, current flows into terminal 29 through planar member 8, fins 12 and planar member 9 to the anodes of rectifiers 2A, 2B, 2C and 2D, through them to their cathodes and from there through planar member 11, fins 13, planar member 10 to terminal 30.

While it is possible to utilize one tie bolt and its associated springs to apply clamping pressure to rectifiers 2A and 2C and utilize another tie bolt and its associated springs to apply clamping pressure to rectifiers 2B and 2D, such a construction scheme is not preferred. In order to clamp the rectifiers in that manner, tie bolt 18 would have to be relocated between rectifiers 2A and 2C while tie bolt 19 would have to be relocated between rectifiers 2B and 2D. Such a construction would have two drawbacks, namely, (1) the tie bolts would block the cooling passages passing directly over the rectifiers and (2) machining of contact surfaces 16 and 17 would be required to insure that they are extremely flat so that they apply equal pressure to the rectifiers sandwiched therebetween, since the contact electrodes are relatively inflexible about the Y-axis.

Figure 4:
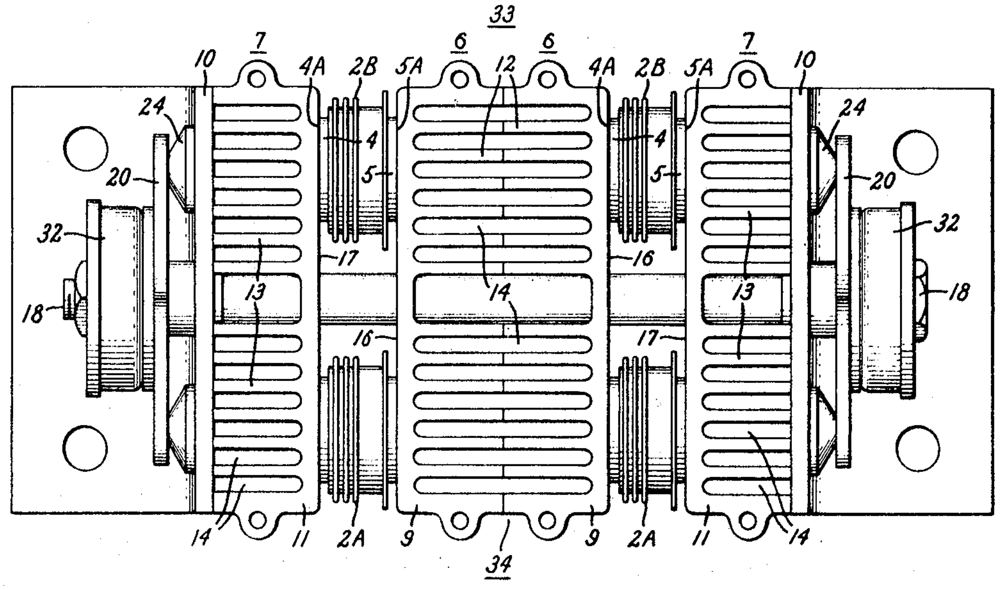
FIG. 4 is a plan view of another pressure assembly in accordance with our invention.

FIG. 4 shows another pressure assembly 33 using our invention. This assembly is adapted for higher voltage applications than the assembly shown in FIGS. 1–3 since it contains two rectifiers in series in each of the four parallel paths. As should be appreciated assembly 33 can be constructed by using two of the pressure assemblies shown in FIG. 1. In that regard planar member 8, its conical members 24, springs 21 and 23 and washers 18B are removed from one assembly of FIG. 1 while the corresponding parts of another like assembly are also removed. The tie bolts 18 and 19 are extended to accommodate two modified assemblies 1 therebetween. These assemblies are connected to one another with the fins, 12, of one heat dissipating electrode 6 abutting like fins, 12, of the other heat dissipating electrode 6. The combination of these two contact electrodes creates an intermediate heat dissipating electrode 34. If the rectifiers are oriented so that they are poled in the same direction an electrical assembly 33 is provided which is equivalent to two of the assemblies shown in FIG. 1 connected in series. Electrode 34 is at an electrical potential intermediate the anode and cathode potentials. In order to insure against any accidental short circuit or arcing in such a configuration, tie bolts 18 and 19 are electrically connected to intermediate electrode 34 so as to be at a potential intermediate the anode or cathode electrodes through which they pass.

Assembly 34 has wide electrical utility in that it can also be connected to form an AC switch by merely electrically connecting electrodes 7 together to form one side of the switch while using intermediate electrode 34 to form the other side of the switch. In such an arrangement only one insulator cup 32 on each tie bolt would be required.

Either assembly 1 or assembly 34 can be modified for lower current handling capabilities by utilizing dummy devices in lieu of some of the semiconductor rectifiers 2A–2D. For example, assembly 1 can be utilized for lower current applications by replacing rectifier 2B with a dummy device (i.e., a device which is of the same axial dimension as the rectifier device but which does not conduct current). Any combination of semiconductor rectifiers and dummy devices can be used as desired.

Any of the assemblies shown herein can also be modified to utilize more than two pairs of rectifiers for higher current applications. Such a modification would merely involve lengthening the contact electrodes in the Z direction to accommodate the added pair(s) of rectifiers and their associated tie bolt-leaf spring clamping configuration(s).

While we have shown and described particular embodiments of our invention, it will be obvious to those skilled in the art that various changes and modifications may be made without departing from our invention in its broader aspects; and we, therefore, intend herein to cover all such changes and modifications as fall within the true spirit and scope of our invention.

What we claim as new and desire to secure by Letters Patent of the United States is:

1. In a semiconductor rectifier assembly:

a. first and second pairs of semiconductor rectifier devices, each device including a semiconductor body in sealed housing between a pair of main electrodes having external first and second contact surfaces on opposite sides of the housing, said surfaces being parallel to one another, b. means for mounting said devices with the axes of each rectifier pair lying in parallel planes and with their main electrodes held under high clamping pressure, said mounting means including: first and second heat dissipating electrodes disposed on opposite sides of said devices for transmitting a high clamping pressure thereto, each of said electrodes comprising:

i. a first member having at least one planar surface disposed generally parallel to said contact surfaces;

ii. a second member; and iii. a plurality of force transmitting heat dissipating fins disposed between and connected to said members and in intimate heat engagement with said first member to form a plurality of cooling fluid passages disposed immediately adjacent said planar surface, the planar surface of the first member of said first electrode being in intimate heat engagement with the first contact surface of each of said devices, and the planar surface of the first member of said second electrode being in intimate heat engagement with the second contact surface of said devices; and c. force applying means for applying clamping forces to said electrodes, said forces being centered coaxially on the respective devices and being transmitted to said devices through the first and second members and the heat dissipating fins, said force applying means comprising: first and second pressure applying means, said first means being associated with and disposed between the rectifiers of said first pair, said second means being associated with and disposed between the rectifiers of said second pair, each of said means comprising:

i. a two ended tension member passing through said electrodes centrally between and in the plane of its associated pair of rectifiers;

ii. resilient means disposed between one end of said tension member and selected points on said second member of said first electrode coaxial with said associated rectifiers.

2. The semiconductor rectifier assembly as specified in claim 1 wherein the amount of tension on said tension members is separately adjustable, and wherein said tension members each comprise elongated tie bolts electrically insulated from at least one of said electrodes.

3. The semiconductor rectifier as specified in claim 2 wherein said resilient means comprises a leaf spring with means thereon for insuring that contact is made with said second member only at said selected points, said leaf spring being connected to said tie bolt.

4. The semiconductor rectifier assembly as specified in claim 3 wherein an insulating member is disposed between the leaf spring and the tie bolt to which it is connected.

* * * * *